United States Patent
Nishida et al.

(10) Patent No.: US 8,012,841 B2
(45) Date of Patent: Sep. 6, 2011

(54) LASER ANNEALING METHOD AND LASER ANNEALING DEVICE

(75) Inventors: Kenichiro Nishida, Tokyo (JP);
Ryusuke Kawakami, Tokyo (JP);
Norihito Kawaguchi, Tokyo (JP);
Miyuki Masaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 420 days.

(21) Appl. No.: 12/159,259

(22) PCT Filed: Nov. 7, 2006

(86) PCT No.: PCT/JP2006/322144
§ 371 (c)(1),
(2), (4) Date: Jun. 26, 2008

(87) PCT Pub. No.: WO2007/080693
PCT Pub. Date: Jul. 19, 2007

(65) Prior Publication Data
US 2010/0221898 A1    Sep. 2, 2010

(30) Foreign Application Priority Data

Jan. 13, 2006 (JP) .................. 2006-005864
May 29, 2006 (JP) .................. 2006-148337

(51) Int. Cl.
*H01L 21/336* (2006.01)
(52) U.S. Cl. ... 438/308; 438/149; 438/166; 257/E21.17; 257/E21.134; 257/E21.347; 257/E21.475
(58) Field of Classification Search .................. 438/149, 438/163, 166, 308, 378, 463, 533, 680; 257/E21.17, 257/134, 347, 475
See application file for complete search history.

(56) References Cited

U.S. PATENT DOCUMENTS

| | | | | |
|---|---|---|---|---|
| 6,038,075 A | * | 3/2000 | Yamazaki et al. | 359/626 |
| 6,157,492 A | * | 12/2000 | Yamazaki et al. | 359/623 |
| 6,567,219 B1 | * | 5/2003 | Tanaka | 359/624 |
| 7,078,281 B2 | | 7/2006 | Tanaka et al. | |
| 7,160,765 B2 | * | 1/2007 | Tanaka | 438/166 |
| 7,327,916 B2 | | 2/2008 | Tanaka | |

(Continued)

FOREIGN PATENT DOCUMENTS

EP    1457806 A2    9/2004

(Continued)

OTHER PUBLICATIONS

International Search Report issued in corresponding application No. PCT/JP2006/322144, completed Feb. 2, 2007 and mailed Feb. 13, 2007.

(Continued)

*Primary Examiner* — David Nhu
(74) *Attorney, Agent, or Firm* — Fish & Richardson P.C.

(57) ABSTRACT

The energy distribution in the short-side direction of a rectangular laser beam applied to an amorphous semiconductor film (amorphous silicon film) is uniformized. It is possible to the energy distribution in the short-side direction of the rectangular laser beam by the use of a cylindrical lens array 26 or a light guide 36 and concentrating optical systems 28 and 44 or by the use of an optical system including a diffracting optical element. Accordingly, since the effective energy range of a laser beam applied to the amorphous semiconductor film is widened and the transport speed of a substrate 3 can be enhanced as much, it is possible to improve the processing ability of the laser annealing.

12 Claims, 7 Drawing Sheets

U.S. PATENT DOCUMENTS

| | | |
|---|---|---|
| 2003/0042430 A1 | 3/2003 | Tanaka et al. |
| 2003/0068836 A1 | 4/2003 | Hongo et al. |
| 2004/0179807 A1 | 9/2004 | Tanaka |
| 2004/0266223 A1 | 12/2004 | Tanaka et al. |
| 2005/0169330 A1* | 8/2005 | Hongo et al. .............. 372/38.02 |
| 2006/0003478 A1 | 1/2006 | Hongo et al. |
| 2010/0284650 A1 | 11/2010 | Tanaka |

FOREIGN PATENT DOCUMENTS

| | | |
|---|---|---|
| JP | 2003-321081 A | 11/2003 |
| JP | 2003-347237 | 12/2003 |
| JP | 2003-347237 A | 12/2003 |
| JP | 2004-063924 | 2/2004 |
| JP | 2004-063924 A | 2/2004 |
| JP | 2004-095727 | 3/2004 |
| JP | 2004-095727 A | 3/2004 |
| JP | 2004-297058 | 10/2004 |
| JP | 2004-297058 A | 10/2004 |
| JP | 2004-341299 A | 12/2004 |
| JP | 2004-342954 | 12/2004 |
| JP | 2004-342954 A | 12/2004 |
| JP | 2005-136218 | 5/2005 |
| JP | 2005-136218 A | 5/2005 |
| JP | 2005-217209 A | 8/2005 |

OTHER PUBLICATIONS

Search Report, European Application No. 06823057.2; PCTEP11713/11785, dated Dec. 29, 2010, 7 pages.

Office Action (Chinese Patent Application No. 200680050867.1) mailed Jan. 8, 2010 with full English translation.

* cited by examiner

DEPENDENCE OF AVERAGE CRYSTAL GRAIN SIZE ON THE NUMBER
OF APPLICATION TIMES OF EFFECTIVE ENERGY
(BEAM SHORT-SIDE HALF-VALUE WIDTH: 50 μm)

DEPENDENCE OF THE NUMBER OF APPLICATION TIMES
OF EFFECTIVE ENERGY ON SUBSTRATE TRANSPORT SPEED
(LASER FREQUENCY: 2kHz ; BEAM SHORT-SIDE HALF-VALUE WIDTH: 50 μm)

ENERGY DISTRIBUTION SHAPE IN SHORT-SIDE DIRECTION

SEM IMAGE OF a-Si FILM TO WHICH LASER BEAM OF SHORT-SIDE FLAT TOP SHAPE IS APPLIED

DEPENDENCE OF AVERAGE GRAIN SIZE ON O.L. RATIO

DEPENDENCE OF RAMAN HALF-VALUE WIDTH ON O.L. RATIO

LASER ANNEALING METHOD AND LASER ANNEALING DEVICE

This is a National Phase Application in the United States of International Patent Application No. PCT/JP2006/322144 filed Nov. 7, 2006, which claims priority on Japanese Patent Application No. 005864/2006, filed Jan. 13, 2006 and 148337/2006 filed May 29, 2006. The entire disclosures of the above patent applications are hereby incorporated by reference.

TECHNICAL FIELD

The present invention relates to a laser annealing method and a laser annealing device that can reform an amorphous semiconductor film into a polycrystalline semiconductor film by applying a laser beam from a solid laser source to the surface of the amorphous semiconductor film.

BACKGROUND ART

In the field of semiconductor and liquid crystal, in fabricating a thin film transistor (TFT), in order to improve the mobility of carriers, a laser annealing technique of forming polycrystalline silicon by applying a laser beam to an amorphous silicon film (hereinafter, referred to as "a-Si film") formed on a substrate to melt, solidify, and re-crystallize the amorphous silicon film has been performed.

In the laser annealing technique, a pulse laser beam emitted from a laser source is processed into a rectangular beam having a longitudinal section by the use of an optical system and the rectangular beam is applied to the a-Si film on the substrate while relatively moving the rectangular beam relative to the applying surface in a short-side direction of the beam.

An excimer laser is conventionally used as the laser source of the laser annealing technique, but a laser annealing device using a laser beam obtained by converting basic waves of a solid laser such as YAG, YLF, and YVO$_4$ into a visible domain in wavelength has attracted attention (for example, see Patent Documents 1 to 3). The solid laser is useful because it is more advantageous in cost and maintenance than the excimer laser.

In polycrystalline silicon devices or crystallized silicon devices, it is reported that a wavelength-converted beam of a solid laser can be used in processes of activating impurities, etc.

[Patent Document 1] Japanese Laid-Open Patent Publication No. 2004-342954
[Patent Document 2] Japanese Laid-Open Patent Publication No. 2004-63924
[Patent Document 3] Japanese Laid-Open Patent Publication No. 2003-347237

In a laser annealing device employing a visible beam of a solid laser, crystals of a semiconductor film are made to grow in the plane direction of the film (referred to as "unidirectional growth") by uniformizing an energy distribution in the long-side direction of the rectangular laser beam but using the Gaussian energy distribution of the original beam without processing the rectangular laser beam in the short-side direction thereof, thereby obtaining large-diameter crystal grains.

However, since an anisotropic property is given to the crystal grains for the unidirectional growth and a growing distance is affected by deviation in energy every short of a laser pulse, it is difficult to fabricate isotropic and uniform crystal grains. Accordingly, characteristics of transistors are not uniform.

Since the absorption coefficient of a visible beam in a silicon film is low, the energy use efficiency of an incident laser beam is low and much energy is required for crystallization in the laser annealing technique using a visible beam of the solid laser. Accordingly, there is a problem that the processing ability is low.

By applying a laser beam with a low energy density to slow the gradation of the Gaussian energy distribution and thus to suppressing the unidirectional growing distance, it is possible to obtain isotropic and uniform crystal grains by the use of the solid laser. However, the application of a laser beam with a low energy density causes the more decrease in processing ability.

DISCLOSURE OF INVENTION

The invention is contrived in consideration of the above-mentioned problems. An object of the invention is to provide a laser annealing method and a laser annealing device that can provide isotropic and uniform crystal grains and enhance the processing ability by using a solid laser advantageous in cost and maintenance.

In order to achieve the above-mentioned object, according to a first aspect of the invention, there is provided a laser annealing method of reforming an amorphous semiconductor film into a polycrystalline semiconductor film by concentrating a laser beam emitted from a solid laser source into a rectangular laser beam on the surface of the amorphous semiconductor film and applying the rectangular laser beam thereto while moving the rectangular laser beam relative to the amorphous semiconductor film in the short-side direction of the rectangular laser beam, comprising the steps of: uniformizing an energy distribution in the short-side direction of the rectangular laser beam; and applying the rectangular laser beam to the amorphous semiconductor film.

According to a second aspect of the invention, there is provided laser annealing device for reforming an amorphous semiconductor film into a polycrystalline semiconductor film by concentrating a laser beam emitted from a solid laser source into a rectangular laser beam on the surface of the amorphous semiconductor film and applying the rectangular laser beam thereto while moving the rectangular laser beam relative to the amorphous semiconductor film in the short-side direction of the rectangular laser beam, comprising: a short-side-direction uniformizing means for uniformizing an energy distribution in a short-side direction of the rectangular laser beam, short-side-direction uniformizing means being disposed in an optical path of the laser beam.

The "rectangular beam" includes a visually linear beam as a longitudinal rectangular beam.

As the thermocoagulation analysis result of a crystallization mechanism using a visible beam of a solid laser, it can be seen that it is necessary to apply energy (defined as "effective energy") greater than predetermined energy so as to fabricate isotropic and uniform crystal grains. It can be also seen that the diameter of the crystal grains is determined by the number of input times of the effective energy and the energy smaller than the effective energy does not contribute to the growth of the crystal grains. In the past, since the energy distribution in the short-side direction of the rectangular beam applied to the amorphous semiconductor film was the Gaussian distribution, the effective energy range was a very small range in the vicinity of the center of the Gaussian distribution. Accordingly, when the transport speed of the substrate is not made to be slow, the necessary number of application times could not be obtained.

On the contrary, in the first and second aspects of the invention, the energy distribution is converted from the Gaussian distribution into a flat top shape by uniformizing the energy distribution in the short-side direction of the rectangular beam. In this way, by converting the energy distribution, the effective energy range can be widened with the same power as in the past. Accordingly, the effective energy range in which the laser beam is applied to the amorphous semiconductor film is widened, thereby enhancing the transport speed of the substrate as much. Therefore, it is possible to enhance the processing ability of the laser annealing.

Since the energy distribution in the short-side direction of the rectangular beam is uniformized, the unidirectional growth of crystal grains cannot occur, thereby fabricating the isotropic and uniform crystal grains.

According to the first and second aspects, it is possible to obtain the isotropic and uniform crystal grains and to enhance the processing ability while using the solid laser advantageous in cost and maintenance.

A third aspect of the invention is an exemplary embodiment of the second aspect, wherein the short-side-direction uniformizing means includes a cylindrical lens array or a light guide that dividing the laser beam into a plurality of laser beams in the direction parallel to the short-side direction of the rectangular laser beam and a concentrating optical system that concentrates the beam emitted from the cylindrical lens array or the light guide on the surface of the amorphous semiconductor film in the short-side direction of the rectangular laser beam.

A fourth aspect of the invention is an exemplary embodiment of the second aspect, wherein the short-side-direction uniformizing means is an optical system including a diffracting optical element.

According to the third and fourth aspects, since the laser beam is divided in the direction parallel to the short-side direction of the rectangular beam by the use of the short-side-direction uniformizing means and the divided laser beams are concentrated as a rectangular beam on the surface of the amorphous semiconductor film, it is possible to uniformize the energy distribution in the short-side direction of the rectangular beam.

A fifth aspect of the invention is an exemplary embodiment of the second aspect, wherein the amorphous semiconductor film is an amorphous silicon film.

According to the fifth aspect, since the polycrystalline silicon film having isotropic and uniform crystal grains by annealing the amorphous silicon film, it is possible to fabricate an excellent thin film transistor (TFT) having high mobility of carriers.

A sixth aspect of the invention is an exemplary embodiment of the second aspect. In the laser annealing device according to the invention, the solid laser source may be one of an Nd:YAG laser, an Nd:YLF laser, an Nd:YVO$_4$ laser, an Nd:glass laser, an Yb:YAG laser, an Yb:YLF laser, an Yb:YVO$_4$ laser, and an Yb:glass laser.

According to the sixth aspect, it is possible to provide a high energy use efficiency of a stable laser beam by using a solid laser with high reliability.

BEST MODE FOR CARRYING OUT THE INVENTION

Figure 1:
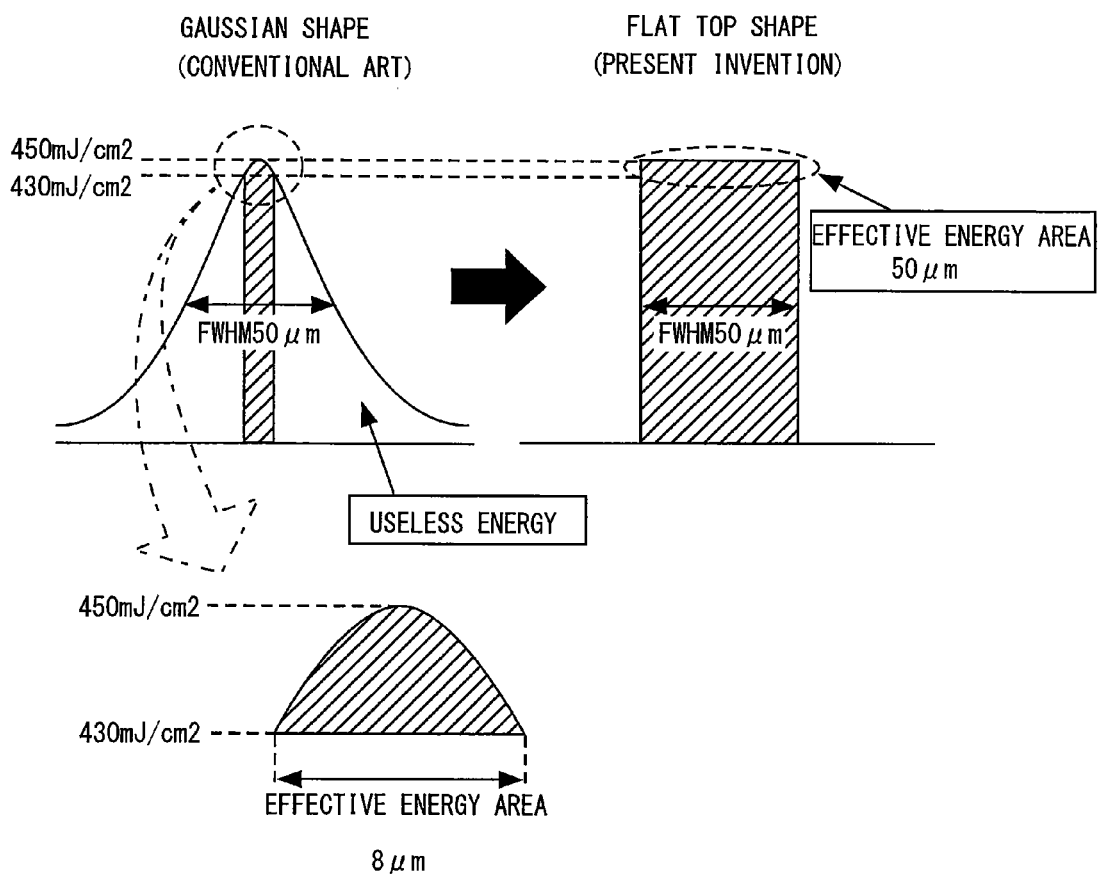
FIG. 1 is a diagram illustrating an image of effective energy in the conventional art and the invention.

Hereinafter, preferred embodiments of the invention will be described in detail with reference to the accompanying drawing. In the drawings, common elements are denoted by like reference numerals and signs and repeated description thereof is omitted.

As described above, in a laser annealing process, a pulse laser beam emitted from a laser source is concentrated in a rectangular beam on the surface of a amorphous semiconductor film (for example, an a-Si film) formed on a substrate by the use of an optical system and the rectangular beam is applied to the amorphous semiconductor film while being moved relative to the amorphous semiconductor film in the short-side direction of the rectangular beam.

FIG. 1 is a diagram illustrating a shape (with peak energy of 450 mJ/cm$^2$ and a half-value width of 50 μm) of an energy distribution in the short-side direction on the applying surface of the rectangular beam, where the left side is a shape of the energy distribution in the conventional art and the right side is a shape of the energy distribution according to the invention. In the past energy distribution in the short-side direction of the rectangular beam has a Gaussian shape.

As the thermocoagulation analysis result of the crystallization mechanism using a visible beam of a solid laser, the inventors found out that it is necessary to apply energy (defined as "effective energy") greater than predetermined energy so as to fabricate isotropic and uniform crystal grains. When crystallizing the a-Si into polycrystalline silicon, the effective energy is 430 mJ/cm$^2$ or more. It could be seen that the diameter of the crystal grains is determined by the number of application times of the effective energy and the energy smaller than the effective energy does not contribute to the growth of the crystal grains.

In the past Gaussian energy distribution shown in FIG. 1, the peak energy is 450 mJ/cm$^2$, the half-value width is 50 μm, and the width of the effective energy region in the short-side direction is 8 μm.

Figure 2:
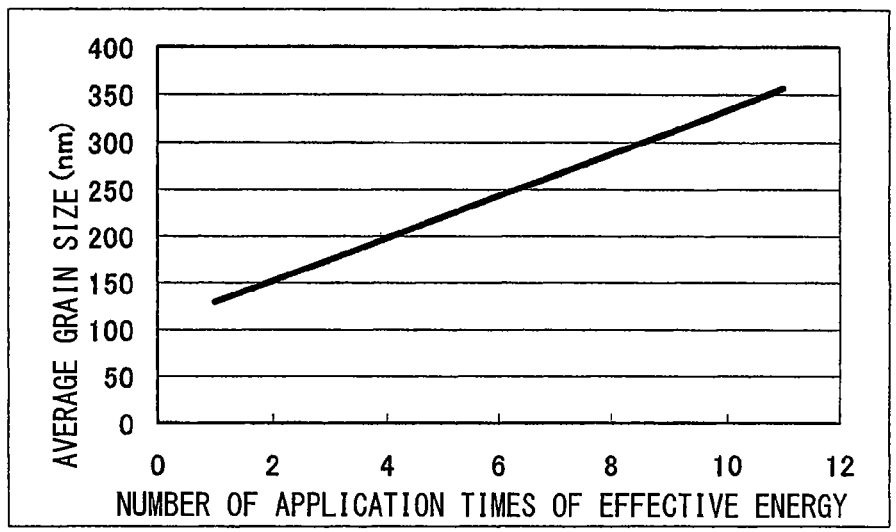
FIG. 2 is a diagram illustrating dependence of an average crystal grain size on the number of application times of effective energy when a Gaussian rectangular beam shown in FIG. 1 is applied.

FIG. 2 shows the dependence of an average diameter of the crystal grains on the number of application times of the effective energy when the rectangular beam having the Gaussian shape shown in FIG. 1 is applied. As shown in FIG. 2, the diameter of crystal grains is determined by the number of application times of effective energy and the energy smaller than the effective energy does not contribute to the growth of the crystal grains as shown in the left of FIG. 1.

Figure 3:
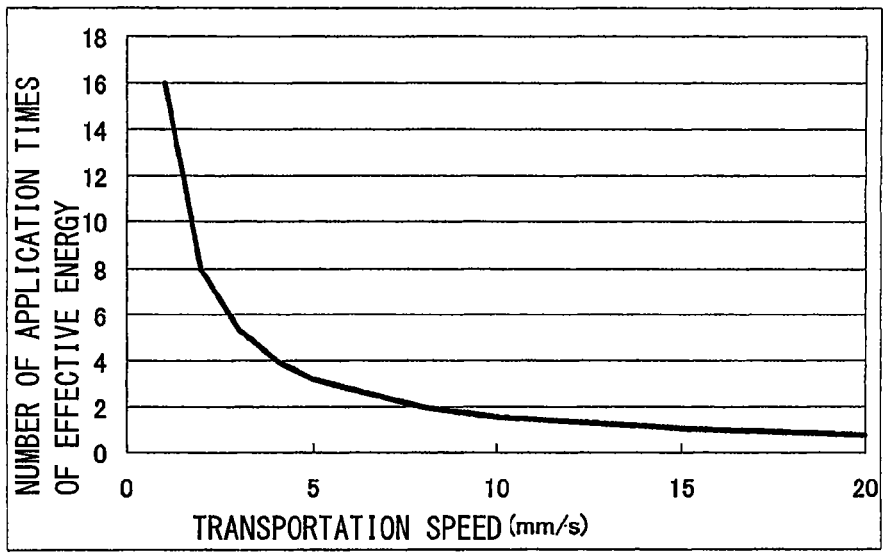
FIG. 3 is a diagram illustrating dependence of the number of application times of effective energy on a substrate transport speed when a Gaussian rectangular beam shown in FIG. 1 is applied.

FIG. 3 shows the dependence of the number of application times of the effective energy on a substrate transport speed when the rectangular beam having the Gaussian shape shown in FIG. 1 is applied. In the past, since the energy distribution in the short-side direction of the rectangular beam has the Gaussian shape, the effective energy range is a very small range (8 μm in the example shown in FIG. 1) in the vicinity of the center of the Gaussian shape. Accordingly, when the substrate transport speed is not made to be slow, the necessary number of application times cannot be obtained.

On the contrary, in the laser annealing method according to the invention, the rectangular beam is uniformized in energy distribution in the short-side direction thereof and then is applied to the amorphous semiconductor film.

The shape of the energy distribution in the short-side direction of the rectangular beam applied in accordance with the laser annealing method of the invention is shown in the right side of FIG. 1. Since the energy distribution in the short-side direction of the rectangular beam is uniformized, the energy distribution is deformed from the past Gaussian shape into a flat top shape.

As shown in FIG. 1, when the non-processed shape is a Gaussian shape with the peak energy of 450 mJ/cm$^2$ and the half-value width of 50 μm and the energy distribution of the rectangular beam is processed into the flat top shape, the effective energy region can be enlarged to 50 μm with the same input power.

Accordingly, according to the laser annealing method of the invention, the effective energy range is widened, thereby enhancing the substrate transport speed as much. In the above-mentioned example, by simple calculation, it is possible to enhance the transport speed to 6.25 times so as to obtain the crystal grains having the same diameter. Therefore, it is possible to rapidly improve the processing ability of the laser annealing process.

Since the energy distribution in the short-side direction of the rectangular beam is uniformized, the unidirectional growth of crystals does not occur, thereby fabricating isotropic and uniform crystal grains.

Therefore, according to the invention, it is possible to obtain the isotropic and uniform crystal grains and to enhance the processing ability while using the solid laser advantageous in cost and maintenance.

A laser annealing device for embodying the laser annealing method is described with reference to several embodiments. However, the invention is not limited to the below embodiments.

First Embodiment

Figure 4:
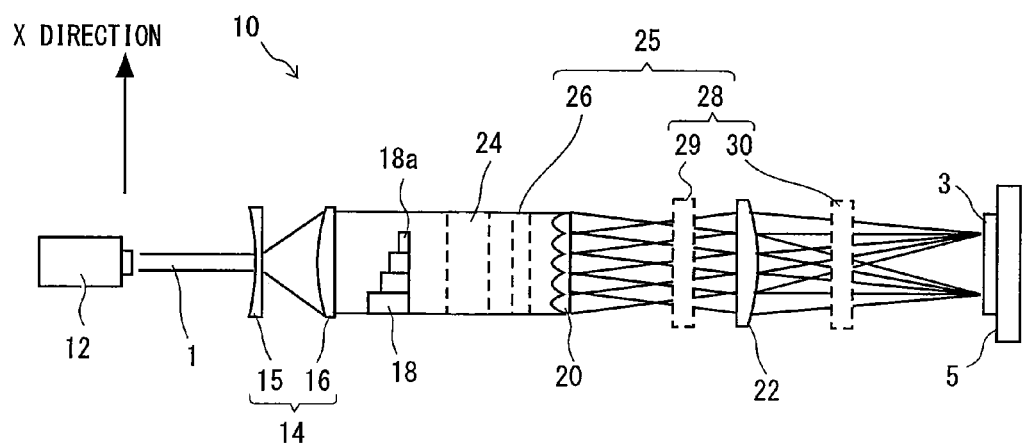
FIG. 4 is a diagram schematically illustrating a configuration of a laser annealing device according to a first embodiment of the invention, where the configuration is associated with the X direction (a long-side direction of the rectangular beam).
Figure 5:
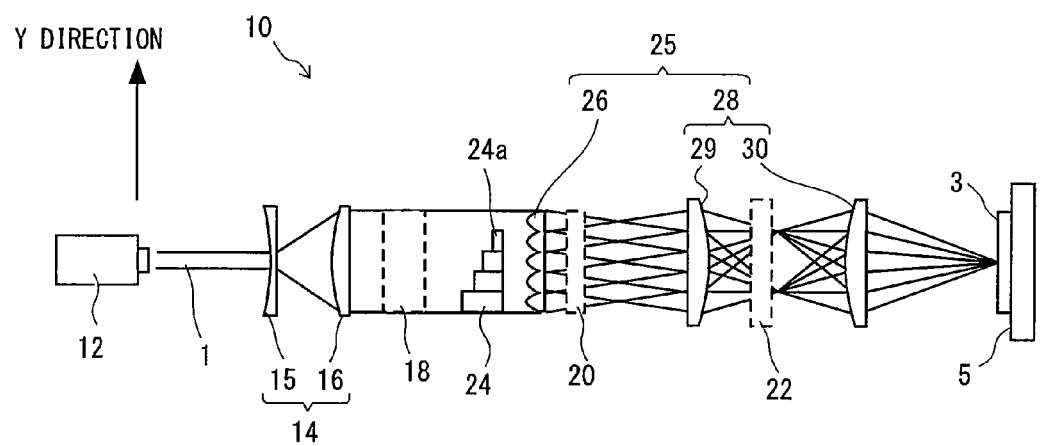
FIG. 5 is a diagram schematically illustrating a configuration of a laser annealing device according to a first embodiment of the invention, where the configuration is associated with the Y direction (a short-side direction of the rectangular beam).

FIGS. 4 and 5 are diagrams schematically illustrating a configuration of a laser annealing device 10 according to a first embodiment of the invention. FIG. 4 is a configurational diagram corresponding to one direction (defined as the X direction) perpendicular to the optical axis of the solid laser source 12 and FIG. 5 is a configurational diagram corresponding to the direction (defined as the Y direction) perpendicular to the optical axis of the solid laser source and the X direction. For the purpose of easy understanding, optical elements acting only in the Y direction are denoted by a virtual line in FIG. 4 and optical elements acting only in the X direction are denoted by a virtual line in FIG. 5.

The laser annealing device 10 is a device for reforming the amorphous semiconductor film into a polycrystalline semiconductor film by concentrating the laser beam 1 emitted from the solid laser source 12 in a rectangular beam on the surface of the amorphous semiconductor film formed on the substrate 3 and applying the rectangular beam to the amorphous semiconductor film while moving the rectangular beam relative to the amorphous semiconductor film in the short-side direction thereof. The relative movement is made by moving a substrate stage 5 having the substrate 3 mounted thereon in the short-side direction (direction perpendicular to the paper surface of FIG. 4) of the rectangular beam.

In this embodiment, the substrate 3 is a glass substrate. A SiO$_2$ film with a thickness of 200 nm is formed on the substrate 3 by the use of a film forming method such as a plasma CVD method and a sputtering method and an a-Si film with a thickness of 50 nm is formed thereon.

In this embodiment, the laser annealing device 10 includes a solid laser source 12 emitting the laser beam 1, a beam expander 14 enlarging the laser beam 1 from the laser source 12 in the X direction and the Y direction, an X-direction coherence reducing optical system 18 reducing the coherence of the laser beam 1 in the X direction, an X-direction cylindrical lens array 20 dividing the laser beam 1 into plural laser beams in the X direction, an X-direction concentrating lens 22 concentrating the laser beam 1, which has been divided into plural laser beams in the X direction, on the applying surface, a Y-direction coherence reducing optical system 24 reducing the coherence of the laser beam 1 in the Y direction, a Y-direction cylindrical lens array 26 dividing the laser beam 1 into plural laser beams in the Y direction, and a Y-direction concentrating lens 28 concentrating the laser beam 1, which has been divided into plural laser beams in the Y direction, on the applying surface, The solid laser source 12 outputs a pulse laser beam 1 at a pulse frequency of 2 to 4 kHz. The kind of the solid laser source 12 is not particularly limited, but may use one of an Nd:YAG laser, an Nd:YLF laser, an Nd:YVO$_4$ laser, an Nd:glass laser, an Yb:YAG laser, an Yb:YLF laser, an Yb:YVO$_4$ laser, and an Yb:glass laser. The solid lasers can provide high reliability and can provide a high use efficiency of stable laser energy.

Since the silicon film has a high absorption coefficient in the visible domain of 330 nm to 800 nm, the YAG laser, the YLF laser, the YVO$_4$ laser, and the glass laser emitting a second or third harmonic pulse laser beam 1 is suitable as the solid laser source 12.

The beam expander 14 includes a concave spherical lens 15 and a convex spherical lens 16 and serves to enlarge the diameter of the laser beam 1 emitted from the solid laser source 12 with the concave spherical lens 15 and to collimate the laser beam with the convex spherical lens 16.

Hereinafter, description is divided into the X direction and Y direction. The X-direction processing of the laser beam 1 is first described with reference to FIG. 4.

The X-direction coherence reducing optical system 18 includes plural transparent glass plates 18a. The width (size in the X direction) of the respective transparent glass plates is equal to the width (size in the X direction) of the individual lenses of the X-direction cylindrical lens array 20 and the transparent glass plates 18a having different lengths in the optical axis direction by a predetermined length greater than the coherent length of the laser beam 1 are arranged in the X direction. Since the optical paths of the laser beam 1 having passed through the transparent glass plates 18a is elongated by the length of glass by the X-direction coherence reducing optical system 18, the laser beam 1 has an optical path difference greater than the coherent length and thus is not affected by the coherence, thereby not cohering with each other.

The laser beam 1 having been enlarged by the beam expander 14 and having passed through the X-direction coherence reducing optical system 18 is divided into plural laser beams in the X direction by the X-direction cylindrical lens array 20. The laser beams 1 divided while passing through the X-direction cylindrical lens array 20 are focused once, are enlarged, and then is concentrated as a rectangular beam longitudinal in the X direction on the applying surface of the substrate 3 by the X-direction concentrating lens 22 including a cylindrical lens. The length in the long-side direction of the rectangular beam can be set to, for example, several tens mm.

The rectangular beam is uniformized in energy distribution in the long-side direction by passing through the X-direction cylindrical lens array 20 and the X-direction concentrating lens 22.

The Y-direction processing of the laser beam 1 will be described now with reference to FIG. 5. The Y-direction coherence reducing optical system 24 includes plural transparent glass plates 24a. The width (size in the Y direction) of the respective transparent glass plates 24a is equal to the width (size in the Y direction) of the individual lenses of the Y-direction cylindrical lens array 26 and the transparent glass plates 24a having different lengths in the optical axis direction by a predetermined length greater than the coherent length of the laser beam 1 are arranged in the Y direction. Since the optical path of the laser beam 1 having passed through the respective transparent glass plates 24a is elongated by the length of glass by the Y-direction coherence reducing optical system 24, the laser beam 1 has an optical path difference greater than the coherent length and thus is not affected by the coherence, thereby not cohering with each other.

The laser beam 1 having been enlarged by the beam expander 14 and having passed through the Y-direction coherence reducing optical system 24 is divided into plural laser beams in the Y direction by the Y-direction cylindrical lens array 26. The laser beams 1 divided while passing through the Y-direction cylindrical lens array 26 are focused once, are enlarged again, and then are concentrated as a rectangular beam having a small width in the Y direction on the applying surface of the substrate 3 by the Y-direction concentrating lens 28 including two cylindrical lenses 29 and 30. That is, the Y-direction concentrating lens 28 corresponds to the "concentrating optical system" of the claims.

The concentrated rectangular beam is uniformized in energy distribution in the short-side direction by passing through the Y-direction cylindrical lens array 26 and the Y-direction concentrating lens 28. That is, in this embodiment, the Y-direction cylindrical lens array 26 and the Y-direction concentrating lens 28 constitutes short-side-direction uniformizing means 25 for uniformizing the energy distribution in the short-side direction of the rectangular beam. The length in the short-side direction of the rectangular beam can be set to several tens μm but need to be set to have an energy density greater than the effective energy density for the purpose of crystallization.

As described above, the a-Si film is crystallized by concentrating the laser beam 1 emitted from the solid laser source 12 into a rectangular beam on the surface of the a-Si film formed on the substrate 3 and applying the laser beam 1 while transporting the substrate 3 in the short-side direction of the rectangular beam by the use of a substrate stage 5 at such a speed that the application ranges of the laser pulse shots overlap with each other. At this time, the transport speed of the substrate 3 is set so that the number of overlapping application times of the laser pulse shots is the number of application times of the effective energy required for obtaining a predetermined crystal grain size (for example, 250 to 350 nm).

In this way, in the laser annealing device 10 according to the first embodiment, as shown in FIG. 1, the energy distribution in the short-side direction of the rectangular beam can be converted into a flat top shape by uniformizing the energy distribution in the short-side direction of the rectangular beam. Accordingly, the effective energy range of the laser beam applied to the a-Si film is widened and the transport speed of the substrate 3 can be enhanced, thereby improving the processing ability of the laser annealing.

In the first embodiment, the X-direction cylindrical lens array 20 and the Y-direction cylindrical lens array 26 have different configurations, but they may be incorporated into one lens array having both functions.

The X-direction coherence reducing optical system 18 and the Y-direction coherence reducing optical system 24 are not essential for the practice of the invention, but it is possible to reduce the coherence of the solid laser beam 1 having high coherence and to apply the laser beam uniformly, by using the coherence reducing optical systems. The X-direction coherence reducing optical system 18 and the Y-direction coherence reducing optical system 24 may have other known configurations, and may employ the configuration described in Japanese Laid-Open Patent Publication No. 2002-321081 or the configuration shown in FIG. 4 of Japanese Laid-Open Patent Publication No. 2004-341299.

Second Embodiment

Figure 6:
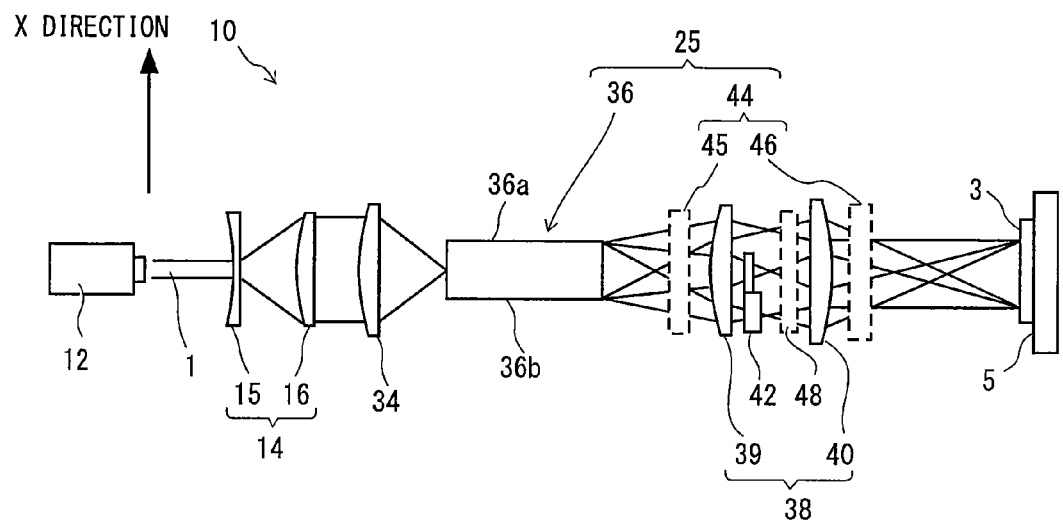
FIG. 6 is a diagram schematically illustrating a configuration of a laser annealing device according to a second embodiment of the invention, where the configuration is associated with the X direction (a long-side direction of the rectangular beam).
Figure 7:
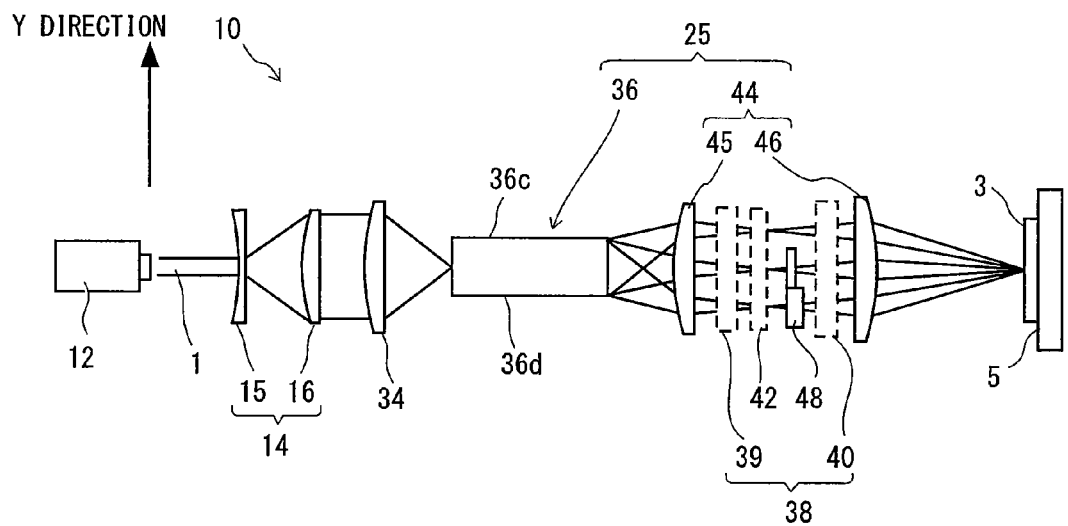
FIG. 7 is a diagram schematically illustrating a configuration of a laser annealing device according to a second embodiment of the invention, where the configuration is associated with the Y direction (a short-side direction of the rectangular beam).

FIGS. 6 and 7 are diagrams schematically illustrating a configuration of a laser annealing device 10 according to a second embodiment of the invention. FIG. 6 is a configurational diagram corresponding to the X direction and FIG. 7 is a configurational diagram corresponding to the Y direction.

For the purpose of easy understanding, optical elements acting only in the Y direction are denoted by a virtual line in FIG. 6 and optical elements acting only in the X direction are denoted by a virtual line in FIG. 7. The X and Y directions in FIGS. 6 and 7 and the elements denoted by the same reference numerals as in FIGS. 4 and 5 represents the same meaning and configurations and thus description thereof is properly omitted.

The laser annealing device 10 is a device for reforming the amorphous semiconductor film into a polycrystalline semiconductor film by concentrating the laser beam 1 emitted from the solid laser source 12 in a rectangular beam on the surface of the amorphous semiconductor film (an a-Si film in this embodiment) formed on the substrate 3 and applying the rectangular beam to the amorphous semiconductor film while moving the rectangular beam relative to the amorphous semiconductor film in the short-side direction thereof.

In this embodiment, the laser annealing device 10 includes a solid laser source 12 emitting a laser beam 1, a beam expander 14 enlarging the laser beam 1 from the laser source 12 in the X and Y directions, an incidence lens 34 guiding the laser beam 1 to a light guide 36, a light guide 36 dividing the incident laser beam 1 into plural laser beams in the X and Y directions, an X-direction end transferring optical system 38 concentrating the laser beams 1, which are divided in the X direction, in the X direction and focusing the laser beams on the applying surface so as to overlap with each other, an X-direction coherence reducing optical system 42 reducing the coherence in the X direction of the laser beams 1, a Y-direction end transferring optical system 44 concentrating the laser beams 1, which are divided in the Y direction, in the Y direction and focusing the laser beams on the applying surface so as to overlap with each other, and a Y-direction coherence reducing optical system 48 reducing the coherence in the Y direction of the laser beams 1.

The light guide 36 is an optical element which is formed of a transparent member having a solid parallel hexahedral shape and which includes X-direction reflecting surfaces 36a and 36b facing each other with a distance therebetween in the X direction along the optical axis and Y-direction reflecting surfaces 36c and 36d facing each other with a distance therebetween in the Y direction along the optical axis, and is made of, for example, BK7 or light refracting glass. The number of channels of the laser beams 1 in the X direction and the Y direction can be set on the basis of the distance between the X-direction reflecting surfaces 36a and 36b, the distance between the Y-direction reflecting surfaces 36c and 36d, and the length in the optical axis direction of the light guide 36.

Hereinafter, description is divided into the X direction and Y direction. The X-direction processing of the laser beam 1 is first described with reference to FIG. 6.

The laser beam 1 enlarged by the beam expander 14 is guided to the light guide 36 by the incidence lens 34 and is divided into plural laser beams in the X direction. The laser beams 1 divided by the light guide 36 are transferred in the X direction by the X-direction end transferring optical system 38 including two cylindrical lenses 39 and 40 and are focused on the applying surface of the substrate 3 as a rectangular beam longitudinal in the X direction. The length in the long-side direction of the rectangular beam can be set to, for example, several tens mm. The X-direction coherence reducing optical system 42 is disposed between two cylindrical lenses 39 and 40 of the X-direction end transferring optical system 38 to reduce the coherence by giving an optical path difference to the divided laser beams 1.

The rectangular beam is uniformized in energy distribution in the long-side direction by passing through the light guide 36 and the X-direction end transferring optical system 38.

The Y-direction processing of the laser beam 1 is described now with reference to FIG. 7.

The laser beam 1 enlarged by the beam expander 14 is guided to the light guide 36 by the incidence lens 34 and is divided into plural laser beams in the Y direction. The laser beams 1 divided by the light guide 36 are transferred in the Y direction by the Y-direction end transferring optical system 44 including two cylindrical lenses 45 and 46 and are focused on the applying surface of the substrate 3 as a rectangular beam narrow in the Y direction. The Y-direction coherence reducing optical system 48 is disposed between two cylindrical lenses 45 and 46 of the Y-direction end transferring optical system 44 to reduce the coherence by giving an optical path difference to the divided laser beams 1. The Y-direction end transferring optical system 44 corresponds to the "concentrating optical system" of the claims.

The concentrated rectangular beam is uniformized in energy distribution in the short-side direction by passing through the light guide 36 and the Y-direction end transferring optical system 44. That is, in this embodiment, the light guide 36 and the Y-direction end transferring optical system 44 constitutes short-side-direction uniformizing means 25 for uniformizing the energy distribution in the short-side direction of the rectangular beam. The length in the short-side direction of the rectangular beam can be set to several tens μm but need to be set to have an energy density greater than the effective energy density for the purpose of crystallization.

As described above, the a-Si film is crystallized by concentrating the laser beam 1 emitted from the solid laser source 12 into a rectangular beam on the surface of the a-Si film formed on the substrate 3 and applying the laser beam 1 while transporting the substrate 3 in the short-side direction of the rectangular beam by the use of a substrate stage 5 at such a speed that the application ranges of the laser pulse shots overlap with each other. At this time, the transport speed of the substrate 3 is set so that the number of overlapping application times of the laser pulse shots is the number of application times of the effective energy required for obtaining a predetermined crystal grain size (for example, 250 to 350 nm).

In this way, as shown in FIG. 1, the energy distribution in the short-side direction of the rectangular beam can be converted into a flat top shape by uniformizing the energy distribution in the short-side direction of the rectangular beam. Accordingly, the effective energy range of the laser beam applied to the a-Si film is widened and the transport speed of the substrate 3 can be enhanced, thereby improving the processing ability of the laser annealing.

In the second embodiment, the laser beam 1 is divided in the X direction and the Y direction by the use of the same light guide 36, but a light guide for division in the X direction and a light guide for division in the Y direction may be separately provided.

The short-side-direction uniformizing means is not limited to the description in the first and second embodiments, but the energy distribution in the short-side direction of the rectangular beam may be uniformized by the use of the well-known optical systems. For example, the short-side-direction uniformizing means may be an optical system including a diffracting optical element. The detailed description of the diffracting optical element is omitted, which is disclosed, for example, in Japanese Laid-Open Patent Publication No. 2005-217209. In the diffracting optical element, minute steps are formed on a substrate of quartz or the like by photolithography and etching processes and diffraction patterns formed by the laser beam passing through the steps are fabricated so as to obtain a desired energy distribution on a focusing surface (substrate surface).

Examples

Hereinafter, examples of the invention will be described.

Figure 8:
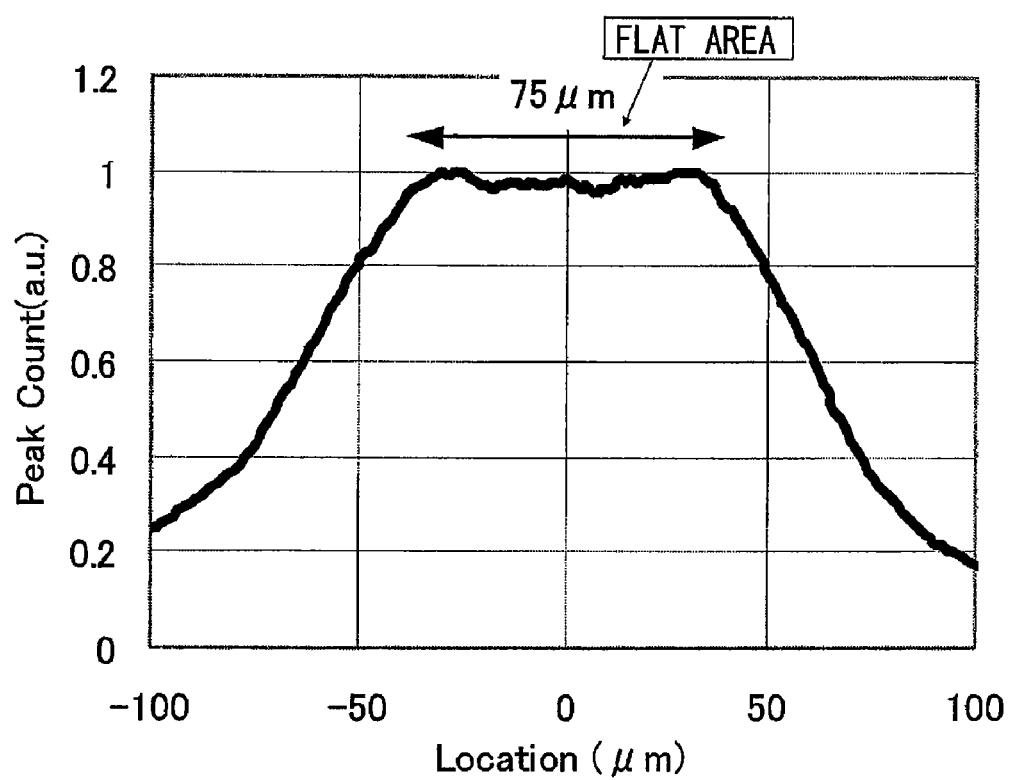
FIG. 8 is a diagram illustrating an energy distribution in the short-side direction when the energy distribution in the short-side direction of the rectangular beam is processed into a flat tope shape by the use of short-side-direction uniformizing means 25 shown in FIG. 5.

FIG. 8 is a diagram illustrating the short-side energy distribution when the energy distribution in the short-side direction of the rectangular beam is processed into a flat top shape by the short-side-direction uniformizing means 25 shown in FIG. 5. It can be seen from FIG. 8 that both ends droop due to the insufficient optimization but the flat region of 75 μm is secured.

Figure 9:
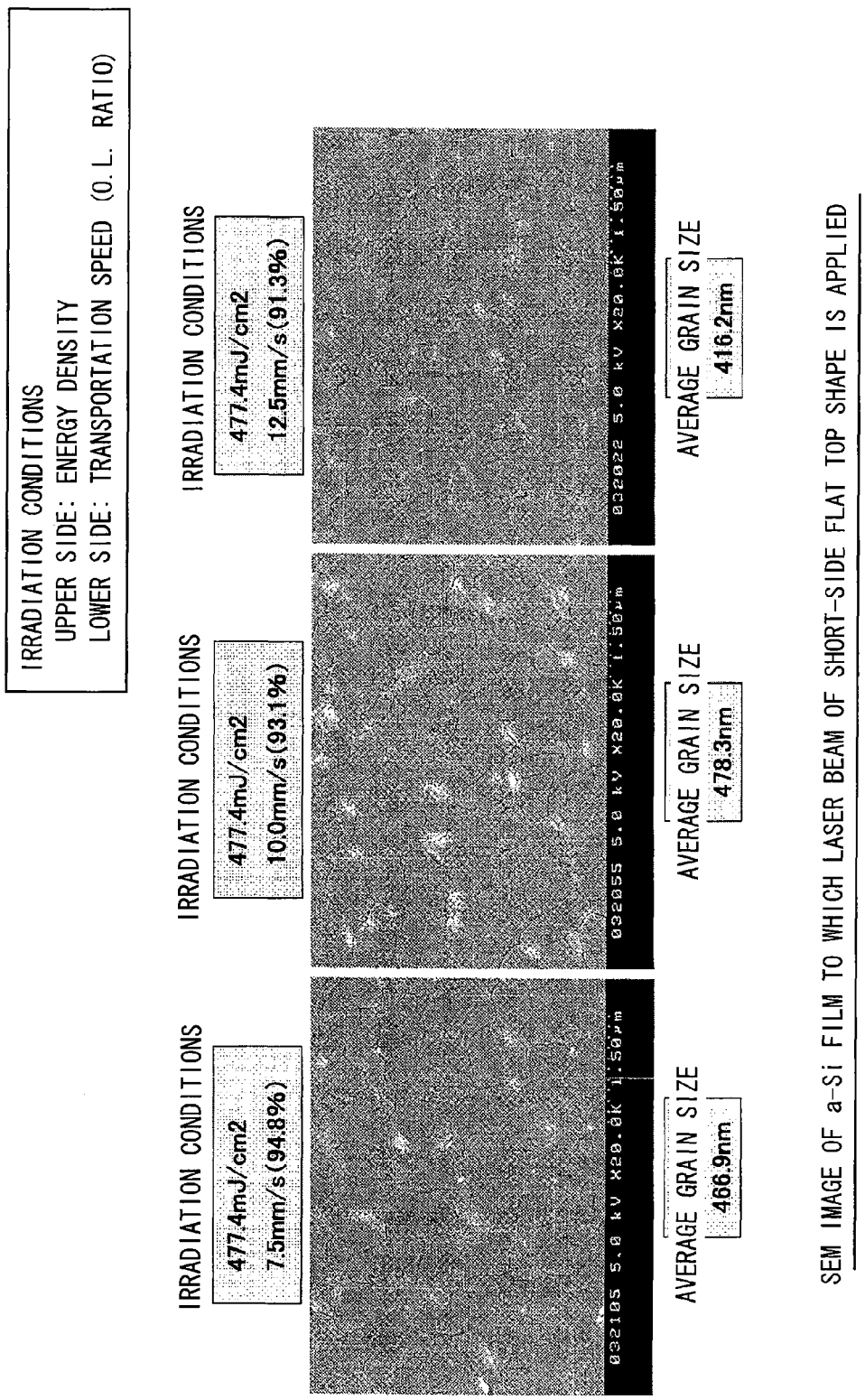
FIG. 9 is a diagram illustrating a SEM image of a sample to which the laser beam of which the energy distribution in the short-side direction is processed into a flat top shape is applied.
Figure 10:
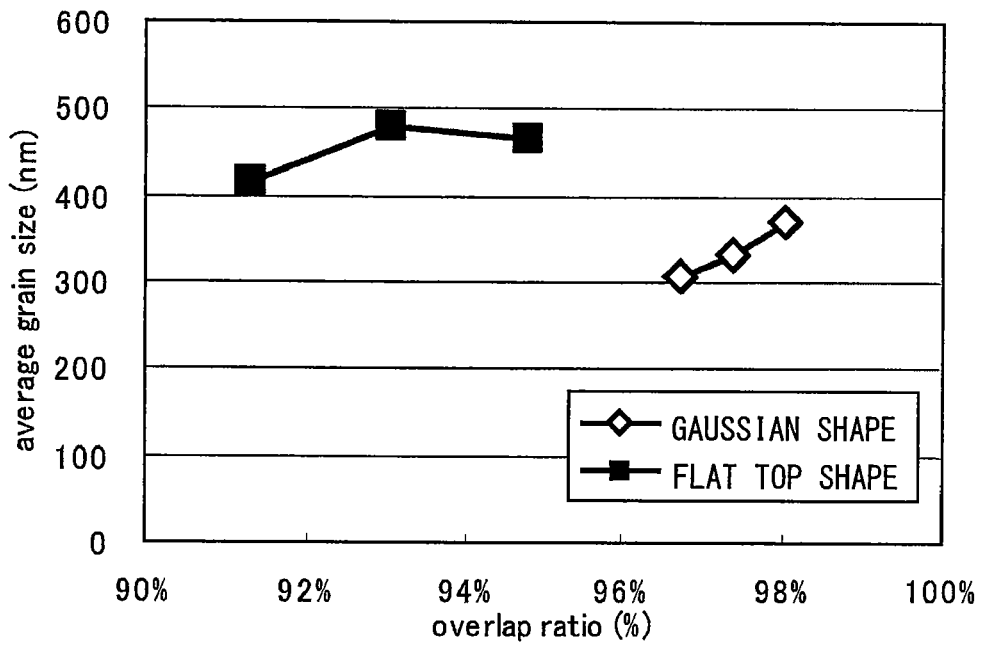
FIG. 10 is a diagram illustrating a relation between an average grain size calculated from the SEM image shown in FIG. 9 and an O.L ratio.

FIG. 9 shows a SEM (Scanning Electron Microscope) image of an a-Si film to which a laser beam of which the short-side energy distribution has been processed into a flat top shape is applied. FIG. 10 shows a relation between an average grain size calculated from the SEM image shown in FIG. 9 and an O.L. (overlap) ratio of two kinds of the flat tope shape and the Gaussian shape. The O.L. ratio means a ratio of a distance, which the substrate moves every laser shot by, to the flat region (half-value width in the Gaussian shape).

It can be seen from FIG. 10 that the Gaussian shape provide an average grain size of 300 to 400 nm at the O.L. ratio of 97% to 98%, while the flat top shape provides an average grain size of 400 nm or more even at the O.L. ratio of 91%. When it is converted into the transport speed, it can be seen that the transport speed increases 4.4 times in maximum.

Figure 11:
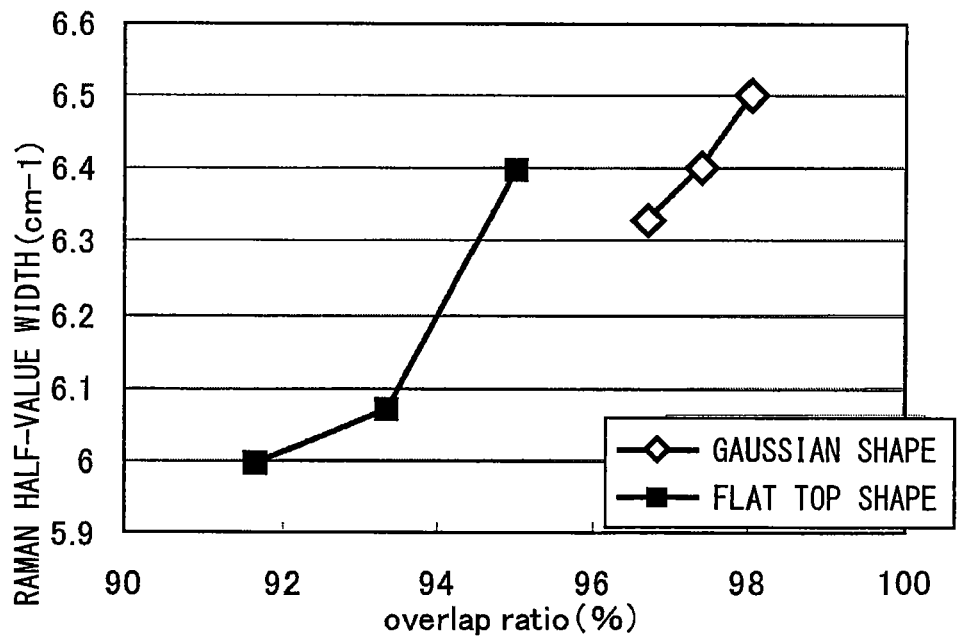
FIG. 11 is a diagram illustrating dependence of a Raman half-value width on the O.L. ratio.

FIG. 11 shows dependence of a Raman half-value width on the O.L. ratio. The Raman half-value width is an indicator indicating a crystallization property and indicates that the performance is more excellent it gets close to the half-value width (4 cm$^{-1}$) of the crystalline silicon. As can be clearly seen form this result, a more excellent crystalline state can be obtained from the flat top shape than the Gaussian shape.

As can be clearly seen from the above description, according to the invention, it is possible to obtain isotropic and uniform crystal grains and to enhance the processing ability by using a solid laser advantageous in cost and maintenance.

Although the embodiments of the invention have been described, the embodiments are merely exemplary and the invention is not limited to the embodiments. For example, although it has been described in the above-mentioned embodiments that the a-Si film is used as the amorphous semiconductor film, other amorphous semiconductor films (for example, a compound semiconductor film such as an amorphous silicon germanium film having an amorphous structure) may be used.

The scope of the invention is determined by the appended claims and includes all the modifications and changes equivalent to the claims and within the scope of the claims.

The invention claimed is:

1. A laser annealing method of reforming an amorphous semiconductor film into a polycrystalline semiconductor film by concentrating a laser beam emitted from a solid laser source into a rectangular laser beam on a surface of the amorphous semiconductor film and applying the rectangular laser beam thereto while moving the rectangular laser beam relative to the amorphous semiconductor film in a short-side direction of the rectangular laser beam, comprising:
   uniformizing an energy distribution in the short-side direction of the rectangular laser beam by dividing the laser beam into divided laser beams through a light guide and focusing the divided laser beams through a Y-direction end transferring optical system including two cylindrical lenses; and
   applying the rectangular laser beam to the amorphous semiconductor film,
   wherein a Y-direction coherence reducing optical system, which includes a first transparent glass plate and a second transparent glass plate, is provided between the two cylindrical lenses, and
   wherein a length of the first transparent glass plate is different from a length of the second transparent glass plate.

2. A laser annealing device for reforming an amorphous semiconductor film into a polycrystalline semiconductor film by concentrating a laser beam emitted from a solid laser source into a rectangular laser beam on a surface of the amorphous semiconductor film and applying the rectangular laser beam thereto while moving the rectangular laser beam relative to the amorphous semiconductor film in a short-side direction of the rectangular laser beam, comprising:
   a short-side-direction uniformizing means for uniformizing an energy distribution in a short-side direction of the rectangular laser beam, short-side-direction uniformizing means being disposed in an optical path of the laser beam, wherein the short-side-direction uniformizing means includes:
   a light guide; and
   a Y-direction end transferring optical system, which includes two cylindrical lenses, through which laser beams divided by the light guide pass; and
   a Y-direction coherence reducing optical system, which includes a first transparent glass plate and a second transparent glass plate, between the two cylindrical lenses, and
   wherein a length of the first transparent glass plate is different from a length of the second transparent glass plate.

3. The laser annealing device according to claim 2, wherein the light guide is formed of a transparent member having a solid parallel hexahedral shape, and includes X-direction reflecting surfaces facing each other with a distance therebetween in an X-direction, and Y-direction reflecting surfaces facing each other with a distance therebetween in a Y-direction.

4. The laser annealing device according to claim 2, wherein the short-side-direction uniformizing means is an optical system including a diffracting optical element.

5. The laser annealing device according to claim 2, wherein the amorphous semiconductor film is an amorphous silicon film.

6. The laser annealing device according to claim 2, wherein the solid laser source is one of an Nd:YAG laser, an Nd:YLF laser, an Nd:YVO$_4$ laser, an Nd:glass laser, an Yb:YAG laser, an Yb:YLF laser, an Yb:YVO$_4$ laser, and an Yb:glass laser.

7. The laser annealing device according to claim 2, wherein an energy distribution of the rectangular laser beam has a flat top shape having an energy of 430 mJ/cm$^2$ or more and having a width of 50 μm or more.

8. The laser annealing device according to claim 2, wherein a difference between the length of the first transparent glass plate and the length of the second transparent glass plate is more than a coherent length of the laser beam.

9. The laser annealing device according to claim 2, further comprising:
   an X-direction end transferring optical system, which includes a first cylindrical lens and a second cylindrical lens, between the two cylindrical lenses; and
   an X-direction coherence reducing optical system, which includes a third glass plate and a fourth glass plate, between the first cylindrical lens and the second cylindrical lens,
   wherein the X-direction coherence reducing optical system and the Y-direction coherence reducing optical system are between the first cylindrical lens and the second cylindrical lens.

10. The laser annealing device according to claim 2, wherein the overlap ratio of the rectangular laser beam is 91 to 95%.

11. The laser annealing device according to claim 2, wherein a length in the short-side direction of the rectangular laser beam is several tens of micrometers (μm).

12. The laser annealing device according to claim 2, further comprising:
   a beam expander including a concave spherical lens between the solid laser source and the light guide; and
   an incidence lens between the beam expander and the light guide.

* * * * *